US009910408B2

(12) United States Patent
Nakamura et al.

(10) Patent No.: US 9,910,408 B2
(45) Date of Patent: *Mar. 6, 2018

(54) IMAGE FORMING DEVICE INCLUDING FAN WITH DUCTED AIRFLOW

(71) Applicant: SHARP KABUSHIKI KAISHA, Sakai, Osaka (JP)

(72) Inventors: Hirokazu Nakamura, Sakai (JP); Kimihide Tsukamoto, Sakai (JP); Masaki Amemiya, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/343,107

(22) Filed: Nov. 3, 2016

(65) Prior Publication Data

US 2017/0075302 A1 Mar. 16, 2017

Related U.S. Application Data

(63) Continuation of application No. 15/059,207, filed on Mar. 2, 2016, now Pat. No. 9,519,267, which is a (Continued)

(30) Foreign Application Priority Data

Mar. 14, 2012 (JP) ................................ 2012-057110

(51) Int. Cl.
*G03G 15/20* (2006.01)
*G03G 21/20* (2006.01)
(Continued)

(52) U.S. Cl.
CPC .......... *G03G 21/206* (2013.01); *B65H 5/068* (2013.01); *G03G 15/2017* (2013.01); *G03G 21/20* (2013.01); *H05K 5/0213* (2013.01)

(58) Field of Classification Search
CPC .......... G03G 15/2017; G03G 15/2021; G03G 15/2035; G03G 21/1633; G03G 21/1638
(Continued)

(56) References Cited

U.S. PATENT DOCUMENTS 7,609,991 B2 10/2009 Koshida
7,715,747 B2 5/2010 Kitozaki
(Continued)

FOREIGN PATENT DOCUMENTS

CN 101075108 A 11/2007
JP 2003-167474 6/2003
(Continued)

OTHER PUBLICATIONS

International Search Report for PCT/JP2013/056967 dated Jun. 11, 2013.

(Continued)

*Primary Examiner* — William J Royer
(74) *Attorney, Agent, or Firm* — Nixon & Vanderhye P.C.

(57) ABSTRACT

Disclosed is an image forming apparatus including: a printing paper transport path in which printing paper is transported; a secondary transfer unit and a fixing section both disposed on the printing paper transport path; an open/close cover that, when opened, exposes the printing paper transport path in a main body of the apparatus; a pressure roller, disposed in the fixing section, that presses the printing paper on a side thereof facing the open/close cover against the printing paper transport path; and cooling fans that cool down the pressure roller, wherein the secondary transfer unit and the cooling fans are attached to the open/close cover and disposed at such positions that the secondary transfer unit and the cooling fans move following overlapping paths when the open/close cover is opened/closed.

14 Claims, 9 Drawing Sheets

Related U.S. Application Data continuation of application No. 14/384,587, filed as application No. PCT/JP2013/056967 on Mar. 13, 2013, now Pat. No. 9,317,010.

(51) Int. Cl.
*B65H 5/06* (2006.01)
*H05K 5/02* (2006.01)

(58) Field of Classification Search
USPC ............................................ 399/92, 94, 124
See application file for complete search history.

(56) References Cited

U.S. PATENT DOCUMENTS

| | | | |
|---|---|---|---|
| 7,937,014 | B2 | 5/2011 | Kawamata |
| 8,478,156 | B2 | 7/2013 | Shimoyama et al. |
| 8,725,024 | B2 | 5/2014 | Tashiro |
| 9,317,010 | B2 | 4/2016 | Nakamura et al. |
| 9,519,267 | B2 * | 12/2016 | Nakamura et al. .................. G03G 15/2017 |

FOREIGN PATENT DOCUMENTS

| | | | |
|---|---|---|---|
| JP | 2005-250246 | | 9/2005 |
| JP | 2005-345940 | | 12/2005 |
| JP | 2006-285151 | A | 10/2006 |
| JP | 2010-164860 | | 7/2010 |
| JP | 2010-181667 | A | 8/2010 |
| JP | 2011-064748 | | 3/2011 |

OTHER PUBLICATIONS

Notice of Allowance dated Aug. 17, 2016 in U.S. Appl. No. 15/059,207.

* cited by examiner

IMAGE FORMING DEVICE INCLUDING FAN WITH DUCTED AIRFLOW

This application is a continuation of U.S. patent application Ser. No. 15/059,207 filed Mar. 2, 2016 (pending), which is a continuation of U.S. patent application Ser. No. 14/384,587 filed Sep. 11, 2014 (granted as U.S. Pat. No. 9,317,010, Apr. 19, 2016), which is the U.S. national phase of International Application No. PCT/JP2013/056967 filed 13 Mar. 2013 which designated the U.S. and claims priority to JP 2012-057110 filed 14 Mar. 2012, the entire contents of each of which are hereby incorporated by reference.

TECHNICAL FIELD

The present invention relates to image forming apparatuses including a secondary transfer unit and a fixing section that are disposed on a printing paper transport path.

BACKGROUND ART

Conventional image forming apparatuses fix a toner image on printing paper by means of a structure that sandwiches, between a pair of heated rollers, printing paper carrying an unfused toner image formed thereon. An image forming apparatus capable of such thermal fixing develops a temperature difference between a heating roller that contacts the surface on which the unfused toner image is formed and a pressure roller that contacts the surface on which no unfused toner image is formed, in order to achieve smooth and easy detachment of the printing paper from the pair of rollers. Specifically, there is provided a fan to cool down the pressure roller (see, for example, Patent Documents 1 to 3).

The pair of rollers are heated in the image forming apparatus when the printing paper is fixed. Since temperature falls upon coming in contact with the printing paper, however, the pair of rollers, being wider than the printing paper, develops a temperature difference between some parts thereof that contact the printing paper and the others that do not. This leads to local overheating, which in turn could cause undesirable wearing and damage of the end portions of the rollers. To eliminate this unevenness of temperature in the pressure roller's axial direction, a structure is being considered in which there is provided a ventilation path extending in the pressure roller's axial direction to cool down the entire pressure roller in a uniform manner (see, for example, Patent Document 4).

Some image forming apparatuses have an open/close cover to allow easy access to their interior in removing printing paper that could be jammed during transport and in carrying out maintenance. The structure facilitates removal of jammed paper by distancing the rollers sandwiching the printing paper when the open/close cover is opened.

CITATION LIST

Patent Literature

Patent Document 1: Japanese Patent Application Publication, Tokukai, No. 2005-250246

Patent Document 2: Japanese Patent Application Publication, Tokukai, No. 2010-164860

Patent Document 3: Japanese Patent Application Publication, Tokukai, No. 2003-167474

Patent Document 4: Japanese Patent Application Publication, Tokukai, No. 2006-285151

SUMMARY OF THE INVENTION

Problems to be Solved by the Invention

Patent Documents 1 to 3 do not discuss the position of the fan or the provision (or lack) of the open/close cover. Simply cooling down the pressure roller may not eliminate the unevenness of temperature.

Patent Document 4 discloses a cooling device in which a fan and a ventilation path are connected via an intervening duct that is coupled to an end of the ventilation path, the "end" being defined in terms of the pressure roller's axial direction. The fan needs to be powerful enough to deliver sufficient air down the entire ventilation path. In addition, the pressure roller should have an increased width in its axial direction to make room for the fan, which hinders the reduction of the size of the image forming apparatus.

The present invention, conceived to address these problems, has an object to provide an image forming apparatus, with a size-reduction facilitating structure, that effectively cools down the pressure roller through efficient use of limited internal space.

Solution to Problem

An image forming apparatus in accordance with the present invention includes: a printing paper transport path in which printing paper is transported; a secondary transfer unit and a fixing section both disposed on the printing paper transport path; an open/close cover that, when opened, exposes the printing paper transport path in a main body of the apparatus; a pressure roller, disposed in the fixing section, that presses the printing paper on a side thereof facing the open/close cover against the printing paper transport path; and cooling fans that cool down the pressure roller, wherein the secondary transfer unit and the cooling fans are attached to the open/close cover and disposed at such positions that the secondary transfer unit and the cooling fans move following overlapping paths when the open/close cover is opened/closed.

This structure efficiently utilizes limited internal space to effectively cool down the pressure roller, thereby providing a size-reduction facilitating structure. The attaching of the cooling fans to the open/close cover prevents the structure from disrupting the travel of the secondary transfer unit when the open/close cover is opened/closed.

The image forming apparatus in accordance with the present invention may further include cooling ducts that guide air from the cooling fans to the pressure roller, the cooling ducts delivering air toward a surface of the pressure roller near a nip section where the pressure roller presses the printing paper.

This structure enables concentrated cooling of the upstream of the nip section by means of the cooling ducts, thereby preventing improper fixing by the fixing section. More specifically, since the pressure roller is rotating while transporting printing paper, the nip section can be cooled down by cooling any part of the pressure roller. The cooled part, however, is heated by the heat transferred from the surroundings, which lessens the cooling effects before reaching the nip section. It is therefore preferable to cool down those parts that are as close to the nip section as possible. The provision of the cooling ducts alleviates constraints on the positions of the cooling fans, enabling the cooling fans to be disposed where there exists sufficient space.

The image forming apparatus in accordance with the present invention may be such that the cooling ducts each have an air guiding face that guides air from one of the cooling fans toward the pressure roller.

This structure provides air guiding faces that unfailingly enable air from the cooling fans to be guided toward the pressure roller.

The image forming apparatus in accordance with the present invention may be such that the air guiding faces tilt in a direction from the cooling fans toward the pressure roller.

This structure allows the cooling ducts to have a simple shape.

The image forming apparatus in accordance with the present invention may be such that the cooling ducts are attached to the main body of the apparatus, the cooling fans are housed in respective fixed ducts and attached to the open/close cover, and the fixed ducts are coupled to the respective cooling ducts when the open/close cover is closed.

This structure, by allowing the cooling ducts to move, does not let the cooling ducts contact the pressure roller. One can hence freely design the structure of the cooling ducts.

The image forming apparatus in accordance with the present invention may further include blocking walls that block an air flow from the secondary transfer unit to the cooling fans.

This structure provides blocking walls that prevent the cooling fans from attracting the toner scattered by the secondary transfer unit.

The image forming apparatus in accordance with the present invention may be such that the cooling fans are disposed at positions facing the pressure roller at end portions of the pressure roller in terms of an axial direction thereof.

This structure cools down the end portions of the pressure roller of which the temperature is difficult to lower, thereby alleviating uneven temperature of the pressure roller. More specifically, the pressure roller cools down on its surface because it is in contact with printing paper while transporting it. The end portions of the pressure roller contact printing paper only when the printing paper is of large size. Repeated fixing therefore leads to uneven temperature of the pressure roller. The alleviation of such uneven temperature eliminates improper fixing at the end portions of large-sized printing paper and wearing of the end portions of the overheated fixing section.

The image forming apparatus in accordance with the present invention may be such that the printing paper transport path is a vertical transport path in which printing paper is transported vertically upward, and the cooling fans are disposed below the pressure roller.

This structure disposes the cooling fans where the pressure roller is more effectively cooled.

The image forming apparatus in accordance with the present invention may further include a temperature sensing section that senses temperature of the surface of the pressure roller, the temperature sensing section being disposed closer to an end portion of the pressure roller in terms of an axial direction thereof than a region cooled by the cooling fans is to that end portion.

This structure enables sensing of the temperature of a region not directly cooled by the cooling fans, thereby giving an approximate understanding of levels of temperature unevenness.

The image forming apparatus in accordance with the present invention may further include a temperature sensing section that senses temperature of the surface of the pressure roller, the temperature sensing section being disposed at a position that matches that of one of the cooling fans when viewed perpendicular to an axial direction of the pressure roller and that is distanced from a region cooled by the cooling fans.

This structure enables sensing of the temperature of the region cooled by the cooling fans without receiving the air delivered by one of the cooling ducts.

The image forming apparatus in accordance with the present invention may be such that the cooling fans are controlled in terms of rotational speed thereof based on a result of the sensing by the temperature sensing section.

This structure controls the rotational speed of the cooling fans so as to maintain the pressure roller at a suitable temperature, which in turn further alleviates uneven temperature.

Advantageous Effects of the Invention

The present invention efficiently utilizes limited internal space to effectively cool down the pressure roller, thereby providing a size-reduction facilitating structure. The attaching of the cooling fans to the open/close cover prevents the structure from disrupting the travel of the secondary transfer unit when the open/close cover is opened/closed.

DESCRIPTION OF EMBODIMENTS

The following will describe an image forming apparatus in accordance with an embodiment of the present invention in reference to drawings.

Figure 1:
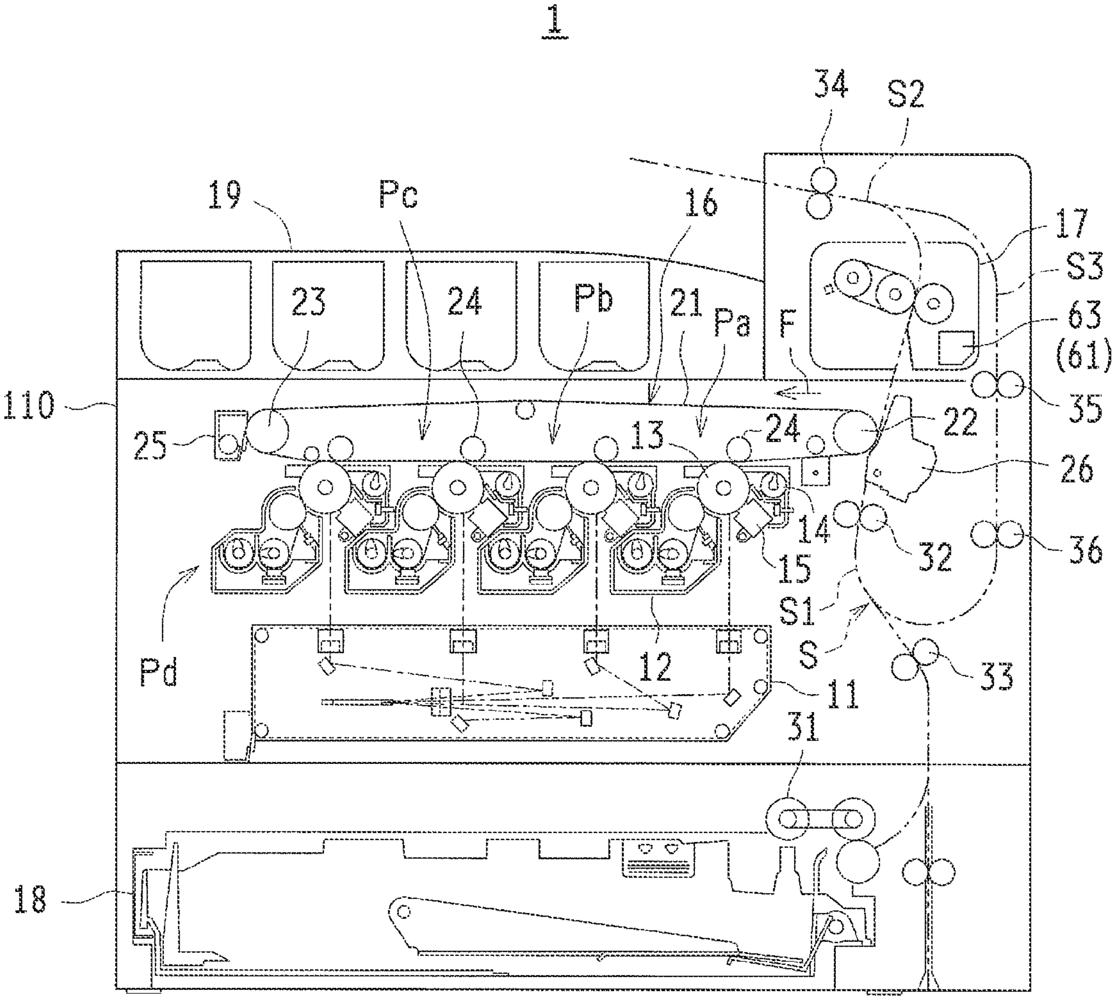
FIG. 1 is a schematic cross-sectional view of an image forming apparatus in accordance with an embodiment of the present invention.

FIG. 1 is a schematic cross-sectional view of an image forming apparatus 1 in accordance with an embodiment of the present invention.

The image forming apparatus 1 includes an optical scanning unit 11, development units 12, photosensitive drums 13, drum cleaning units 14, charging units 15, an intermediate transfer belt unit 16, a fixing section 17, a printing paper transport path S, a paper-feeding cassette 18, and a paper-ejection tray 19. The image forming apparatus 1 forms a color image represented by image data on printing paper.

The color image is formed by superposing black (K), cyan (C), magenta (M), and yellow (Y) toner images. Accordingly, four sets of the development unit 12, the photosensitive drum 13, the drum cleaning unit 14, and the charging unit 15 are provided to form four toner images of different colors. Each set is associated with a different one of black, cyan, magenta, and yellow to constitute a corresponding image station Pa, Pb, Pc, and Pd.

Each photosensitive drum 13 has a photosensitive layer on its surface which is cleaned by the drum cleaning unit 14 before being charged uniformly to a predetermined electric potential by the charging unit 15. The optical scanning unit 11 is a laser scanning unit (LSU) provided with a laser diode and a reflection mirror. The optical scanning unit 11 scans the surface of the photosensitive drum 13 with a laser beam to draw an electrostatic latent image on the surface of the photosensitive drum 13 in accordance with image data. The development unit 12 develops the electrostatic latent image drawn on the surface of the photosensitive drum 13 with toner to form a toner image on the surface of the photosensitive drum 13.

The intermediate transfer belt unit 16 includes an intermediate transfer belt 21, an intermediate transfer belt drive roller 22, an idler roller 23, four intermediate transfer rollers 24, and a belt cleaning unit 25. The intermediate transfer belt unit 16 is disposed above the photosensitive drums 13.

The intermediate transfer belt 21 is an endless belt. The intermediate transfer belt drive roller 22, the idler roller 23, and the four intermediate transfer rollers 24 stretch and support the intermediate transfer belt 21 in such a manner as to rotate the intermediate transfer belt 21 in the direction indicated by arrow F.

Each intermediate transfer roller 24 is supported rotatably near the intermediate transfer belt 21 and pressed against the photosensitive drum 13 via the intermediate transfer belt 21. The intermediate transfer roller 24 has a metal rod (e.g., stainless steel rod) as a base and also has its surface covered with an electrically conductive elastic material (e.g., EPDM or foamed urethane). The intermediate transfer roller 24 is placed under a high-voltage transfer bias (of opposite polarity (+) from the charge polarity of the toner (−)) to transfer a toner image. The elastic material applies the high voltage to printing paper in a uniform manner. The toner images formed on the surfaces of the photosensitive drums 13 are transferred sequentially onto the intermediate transfer belt 21, to form a color toner image by superposing the toner images of different colors.

A secondary transfer unit 26 (in particular, secondary transfer roller 26*a* [detailed later]; see FIG. 2) is pressed against the intermediate transfer belt drive roller 22 via the intermediate transfer belt 21. The toner image formed on the intermediate transfer belt 21 is transferred to printing paper in a nip area formed between the intermediate transfer belt 21 and the secondary transfer unit 26. The printing paper to which the toner image has been transferred is transported to the fixing section 17 via a primary transport path S1 of the printing paper transport path S. The secondary transfer unit 26 will be described in detail in reference to FIG. 2 (detailed later).

When the printing paper is passed through the fixing section 17, the printing paper is sandwiched, for example, between rollers, heated, and pressed to fix the toner image transferred to the printing paper. Thereafter, the printing paper is passed between transport rollers 34, ejected, and piled onto the paper-ejection tray 19. The fixing section 17 will be described in detail in reference to FIGS. 2 and 3 (detailed later).

The belt cleaning unit 25 is provided with a cleaning blade (cleaning member) that comes into contact with the surface of the intermediate transfer belt 21 to remove residual toner. The toner that remains on the surface of the intermediate transfer belt 21 without being transferred to the printing paper is removed and collected by the belt cleaning unit 25.

The paper-feeding cassette 18, disposed in the bottom of the image forming apparatus 1, is structured to supply printing paper to the printing paper transport path S. At an end portion of the paper-feeding cassette 18 are there provided pickup rollers 31 which pick up printing paper from the paper-feeding cassette 18 a sheet at a time to deliver it down the printing paper transport path S.

The printing paper transport path S is provided in the image forming apparatus 1 to transport printing paper from the paper-feeding cassette 18 to the paper-ejection tray 19 via the secondary transfer unit 26, the fixing section 17, and the like. In the present embodiment, the printing paper transport path S is a vertical transport path in which printing paper is transported vertically upward and constituted by a switchback transport path S2 and a reverse transport path S3 as well as the primary transport path S1. The pickup rollers 31, registration rollers 32, transport rollers 33, the secondary transfer unit 26, and the fixing section 17 are disposed on the primary transport path S1. The transport rollers 34 are disposed on the switchback transport path S2. Transport rollers 35 and 36 are disposed on the reverse transport path S3.

The transport rollers 33 to 36 are small-sized rollers that facilitate and assist the transport of printing paper and disposed on the printing paper transport path S. The printing paper ejected from the fixing section 17 is passed between the transport rollers 34 and piled on the paper-ejection tray 19.

The registration rollers 32 temporarily hold the printing paper transported from the paper-feeding cassette 18 before moving the printing paper to the secondary transfer unit 26 at a timing when the leading edge of the toner image on a photosensitive drum 13 coincides with the leading edge of the printing paper.

To form an image on the backside of printing paper as well as on the front side thereof, the printing paper is transported in reverse direction from the transport rollers 34 to the reverse transport path S3, turned over, and guided again to the registration rollers 32 before having a toner image fixed on the backside of the printing paper similarly to the front side of the printing paper and being ejected onto the paper-ejection tray 19.

The image forming apparatus 1 has an open/close cover 41 (see FIGS. 6 to 9 which will be described later in detail). As the open/close cover 41 is opened, the open/close cover 41 distances itself from a main body 110 of the apparatus 1, thereby exposing the printing paper transport path S (in particular, primary transport path S1). The specific structure of the open/close cover 41 will be described in reference to FIGS. 6 to 9 which will be described later in detail.

Next, the structure of the secondary transfer unit 26 and the fixing section 17 will be described.

Figure 2:
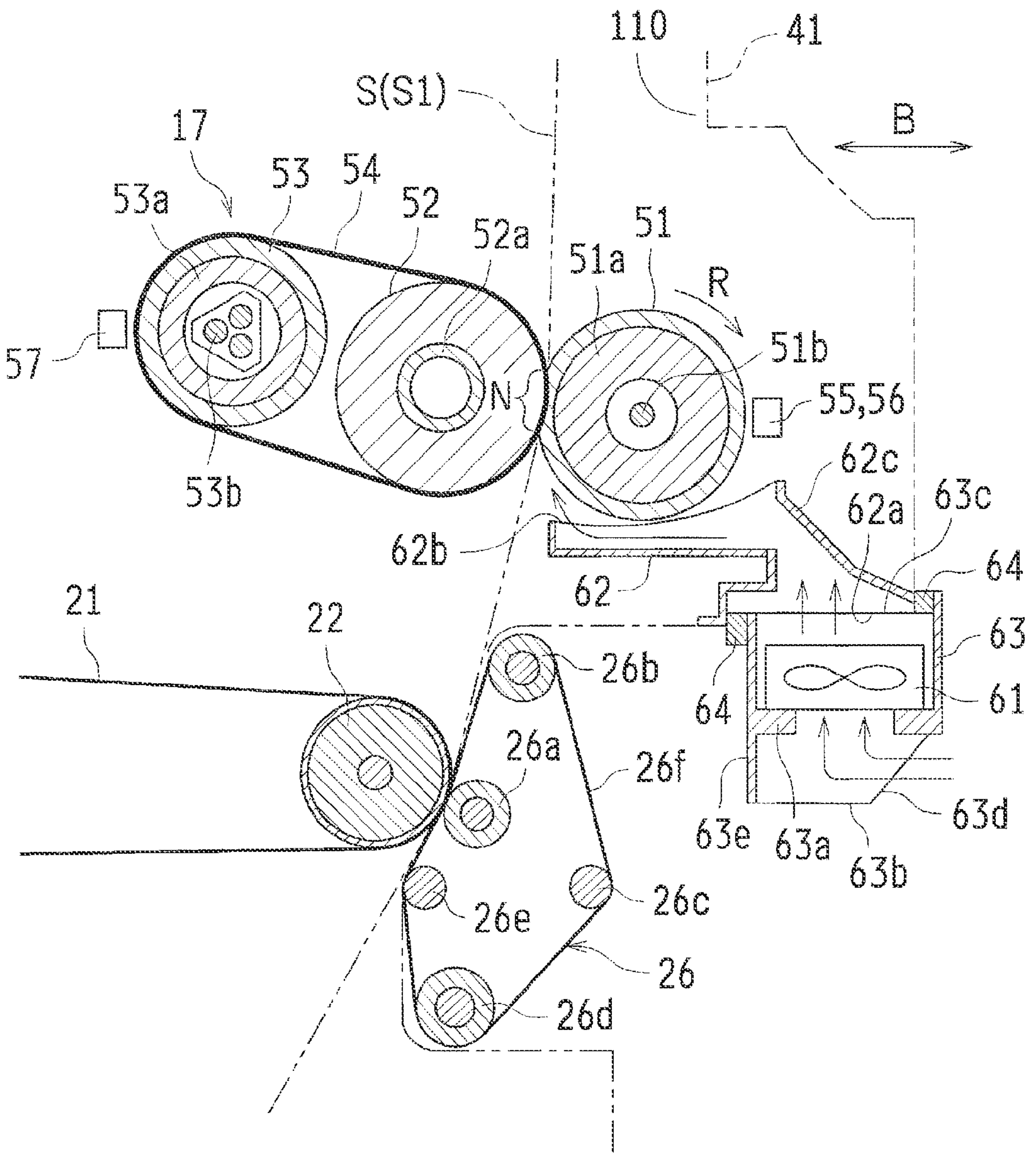
FIG. 2 is a scaled-up cross-sectional view showing in particular a secondary transfer unit and a fixing section in FIG. 1.
Figure 3:
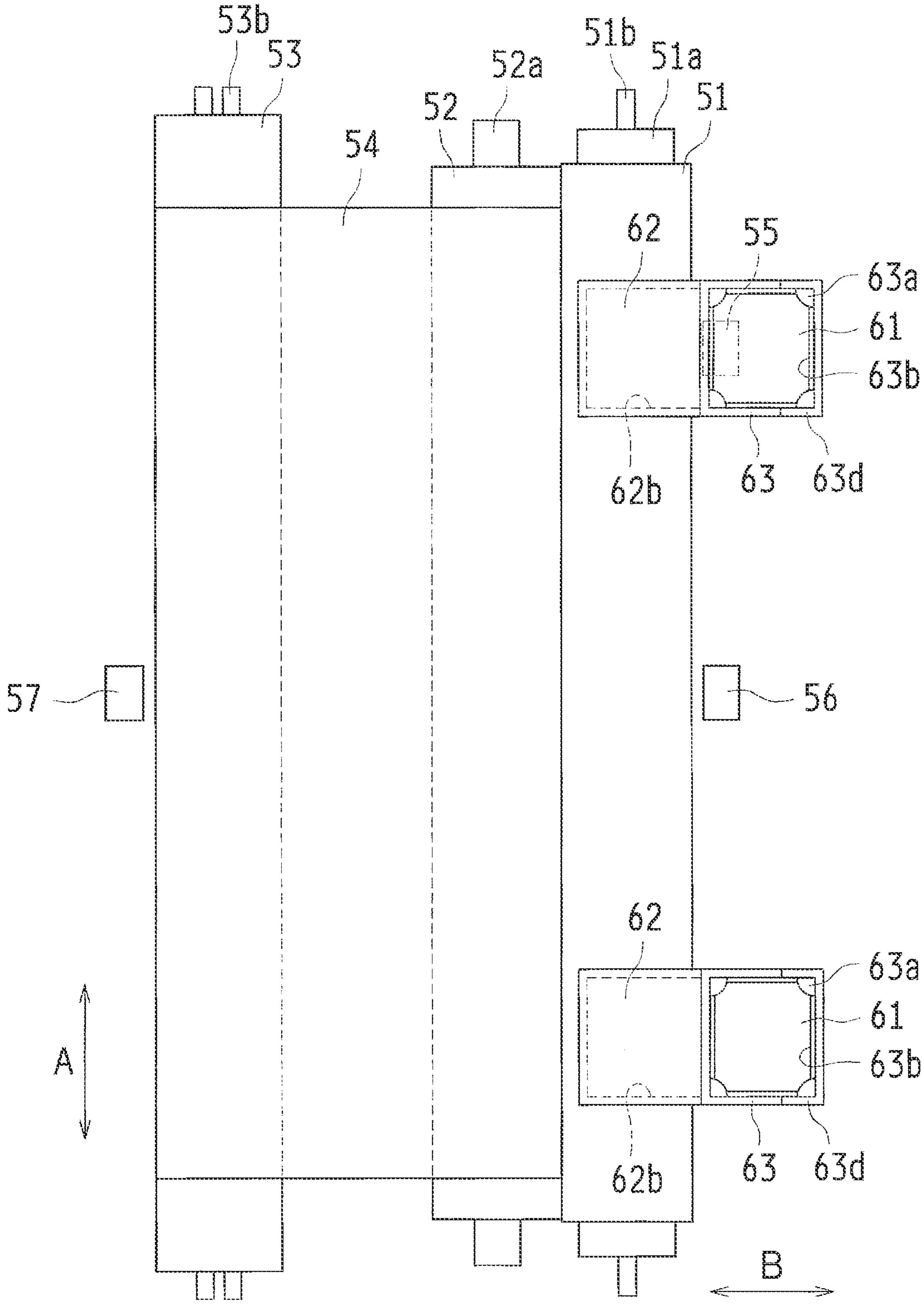
FIG. 3 is a plan view of the fixing section in FIG. 2 as it is viewed from the secondary transfer unit.

FIG. 2 is a scaled-up cross-sectional view showing in particular the secondary transfer unit 26 and the fixing section 17 in FIG. 1. FIG. 3 is a plan view of the fixing section 17 in FIG. 2 as it is viewed from the secondary transfer unit 26.

The secondary transfer unit 26 includes the secondary transfer roller 26*a*, a drive roller 26*b*, an idler roller 26*d*, a first tension roller 26*c*, a second tension roller 26*e*, and a secondary transfer belt 26*f*.

The secondary transfer belt 26*f* is an endless belt and stretched over the secondary transfer roller 26*a*, drive roller 26*b*, idler roller 26*d*, first tension roller 26*c*, and second tension roller 26*e*. In FIG. 2, starting from the secondary transfer roller 26*a*, the drive roller 26*b*, first tension roller 26*c*, idler roller 26*d*, and second tension roller 26*e* are disposed clockwise in this order.

The secondary transfer roller 26*a* is pressed against the intermediate transfer belt 21 via the secondary transfer belt 26*f* and placed under a high voltage (of opposite polarity (+) from the charge polarity of the toner (−)) to transfer the color toner image on the intermediate transfer belt 21 to the printing paper.

The secondary transfer roller 26*a*, drive roller 26*b*, idler roller 26*d*, first tension roller 26*c*, and second tension roller 26*e* have their rotational axes supported by a frame 27 (see FIGS. 6 and 7 which will be described later in detail). The secondary transfer unit 26 is attached to the open/close cover 41 via the frame 27. The specific structure of the frame 27 will be described in reference to FIGS. 6 and 7 which will be described later in detail.

The fixing section 17 is structured to transport printing paper while sandwiching it between a rotation member (fixing belt 54) and a pressure roller 51. The fixing belt 54 has its surface heated by a heating section 53*b*. Specifically, the fixing section 17 operates in belt-based fixing mode and includes the pressure roller 51, a fixing roller 52, a heating roller 53, and the fixing belt 54. Cooling fans 61 are attached to the open/close cover 41 to cool down the pressure roller 51. Air from the cooling fans 61 is guided to the pressure roller 51 by cooling ducts 62.

The pressure roller 51 has a three-layered structure in which there are provided an elastic layer on the outer surface of a hollow pressurizing rotational rod 51*a* and a releasing layer on the outer surface of the elastic layer. The pressurizing rotational rod 51*a* contains therein a heat source (halogen lamp) 51*b* heating the pressure roller 51. In the following description, the direction parallel to the pressurizing rotational rod 51*a* may be referred to as axial direction A, and the rotational direction of the pressure roller 51 abridged as rotational direction R.

The fixing roller 52 includes a hollow fixing rotational rod 52*a* and an elastic layer provided on the outer surface of the fixing rotation rod 52*a*. The elastic layer of the fixing roller 52 has a sufficient thickness.

The heating roller 53 includes a hollow heating rotational rod 53*a* and a surface layer provided on the outer surface of the heating rotational rod 53*a*. The heating rotational rod 53*a* contains therein the heating section (halogen lamp) 53*b* that is a heat source for the heating roller 53.

The fixing belt 54 is an endless belt, made of highly thermally conductive substance, that has a releasing layer on its outer surface. The fixing belt 54 is stretched over the fixing roller 52 and the heating roller 53.

The pressure roller 51 is pressed against the fixing roller 52 via the fixing belt 54, and the elastic layer of the fixing roller 52 has a sufficient thickness. For these reasons, the elastic layer of fixing roller 52 is deeply depressed, establishing a press-contact state between the pressure roller 51 and the fixing roller 52. That in turn forms a wide nip area N between the pressure roller 51 and the fixing roller 52. The pressure roller 51 is disposed to press printing paper on a side thereof facing the open/close cover 41 against the primary transport path S1.

In the present embodiment, the fixing section 17 operates in belt-based fixing mode, and the fixing belt 54 acts as a rotation member. The invention is by no means limited to this embodiment and may provide no fixing belt. In this alternative structure, the pressure roller 51 is directly press-contacted against the fixing roller 52, in which case, the fixing roller 52 acts as a rotation member. Again, in the present embodiment, the heating roller 53 contains the heating section 53*b* therein. The invention is by no means limited to this embodiment and may externally heat up the fixing belt 54.

As mentioned earlier, printing paper may be sandwiched between the pressure roller 51 and the rotation member (fixing belt 54) with a heated surface, to apply heat and pressure to printing paper for reliable fixing of the image.

As mentioned earlier, the printing paper ejected from the secondary transfer unit 26 is transported down the primary transport path S1 before being supplied to the fixing section 17. In other words, the secondary transfer unit 26 is disposed upstream of the fixing section 17 (below the fixing section 17) in terms of the transport direction of the printing paper in the primary transport path S1 (printing paper transport path 5).

Preferably, no roller assisting the transport of printing paper is provided on a part of the primary transport path S1 from the secondary transfer unit 26 to the fixing section 17 because such a roller, if pressed against printing paper carrying thereon an unfused toner image formed by the secondary transfer unit 26, collects toner which sticks to it and may smear the image. Therefore, the distance from the secondary transfer unit 26 (in particular, the secondary transfer roller 26*a*) to the nip area N is preferably shorter than the length of printing paper. The image forming apparatus 1 is capable of forming an image on printing paper of different sizes. Therefore, the image forming apparatus 1 should be capable of transporting printing paper of the smallest size on which the image forming apparatus 1 is capable of forming an image. The distance from the secondary transfer unit 26 (in particular, the secondary transfer roller 26*a*) to the nip area N is shorter than the length of a postcard in the present embodiment.

The cooling fans 61 are disposed along rotational direction R of the pressure roller 51. The cooling fans 61 are distanced farther from the primary transport path S1 in direction B in which the open/close cover 41 is opened/closed than is the secondary transfer unit 26. The cooling fans 61 are located upstream of the pressure roller 51 in terms of the transport direction of printing paper. Specifically, the cooling fans 61 are disposed on the same side of the pressure roller 51 as the secondary transfer unit 26 (below the pressure roller 51). In other words, the cooling fans 61 are disposed on a path followed by the secondary transfer unit 26 when the open/close cover 41 is opened. For example, the cooling fans 61 and the secondary transfer unit 26 are disposed at the same height. In addition, the cooling fans 61 are disposed at positions facing the pressure roller 51 at the end portions of the pressure roller 51, the "end portions" being defined in terms of axial direction A. In the present embodiment, there are provided two cooling fans 61 separated by a distance from each other in axial direction A. The cooling fans 61 are housed in the respective fixed ducts 63. As mentioned earlier, the cooling fans 61 are preferably disposed where the pressure roller 51 is effectively cooled.

In the present embodiment, the distance by which the two cooling fans 61 are separated in axial direction A is greater than A4-sized printing paper and less than A3-sized printing paper. The distance, being greater than frequently used printing paper, enables concentrated cooling of those areas which less frequently come into contact with printing paper. The distance, also being less than the maximum size of printing paper on which the image forming apparatus 1 is capable of forming an image, enables alleviation of uneven temperature for maximum-sized printing paper.

Each fixed duct 63 is shaped like a short tube, appears rectangular in plan view, and is open both on its top and bottom faces. The fixed duct 63 has a projection 63*a* on its internal face, and the cooling fan 61 is secured to the projection 63*a*, for example, with a screw. The fixed duct 63 has an air inlet opening 63*b* formed on its open bottom face and an air outlet opening 63*c* formed on its open top face. Air is externally sucked in through the air inlet opening 63*b*. The air outlet opening 63*c* is open to the cooling duct 62. The cooling fan 61 is attached to the open/close cover 41 by securing the fixed duct 63 to the open/close cover 41. The air inlet opening 63*b* is shaped like a short tube similarly to the fixed duct 63. The air inlet opening 63*b* has a notch 63*d* on its side facing the open/close cover 41 so that air can be readily sucked in from opposite the secondary transfer unit 26. The side face of the fixed duct 63 opposite the notch 63*d* is disposed between the secondary transfer unit 26 and the cooling fan 61, acting as a blocking wall 63*e* that blocks an air flow from the secondary transfer unit 26 to the cooling fan 61. The provision of the blocking wall 63*e* prevents the cooling fan 61 from attracting the toner scattered by the secondary transfer unit 26.

There are provided two corresponding cooling ducts 62 for the two cooling fans 61. The cooling ducts 62 are structured to deliver air from the cooling fans 61 to the surface of the pressure roller 51 near the nip area N. Each cooling duct 62 has a coupling opening 62*a* that is open to one of the cooling fans 61 and a cooling opening 62*b* that is open to the pressure roller 51. The cooling openings 62*b* are open to the upstream neighborhood of the nip area N in terms of rotational direction R. Although different parts of the pressure roller 51 form the nip area N as the pressure roller 51 rotates, the cooling ducts 62 guide air to the part of the pressure roller 51 that is about to reach the nip area N. This structure lowers the elevation of the temperature of the cooled part before that part reaches the nip area N. The coupling openings 62*a* are disposed higher than the secondary transfer unit 26. The cooling ducts 62 are disposed at such positions that the cooling ducts 62 do not disrupt the travel of the secondary transfer unit 26 when the open/close cover 41 is opened/closed.

Each cooling duct 62 has an air guiding face 62*c* that guides air from one of the cooling fans 61 toward the pressure roller 51. More specifically, the air guiding faces 62*c* tilt in a direction from the cooling fans 61 toward the pressure roller 51. The provision of the air guiding faces 62*c* unfailingly enables air from the cooling fans 61 to be guided toward the pressure roller 51. The tilting of the air guiding faces 62*c* allows for the cooling ducts 62 to have a simple shape.

Moltopren® 64, for example, made of buffer material, is provided where the fixed ducts 63 are coupled to the cooling ducts 62, so that the fixed ducts 63 and the cooling ducts 62 are coupled by Moltopren® 64. Moltopren® 64 in the present embodiment is attached to the air outlet openings 63*c*. Therefore, Moltopren® 64, provided between the fixed ducts 63 and the cooling ducts 62, alleviates impact generated when the open/close cover 41 is closed.

The cooling ducts 62 in the present embodiment are attached to the main body 110, and the fixed ducts 63 are attached to the open/close cover 41. In other words, the fixed ducts 63 are structured to be coupled to the cooling ducts 62 when the open/close cover 41 is closed. This structure, by not allowing the cooling ducts 62 to move, does not let the cooling ducts 62 contact the pressure roller 51. One can hence freely design the structure of the cooling ducts 62.

FIG. 2 shows the secondary transfer unit 26 being separated by a distance from the fixed ducts 63 (cooling fans 61). The distance between the secondary transfer unit 26 and the fixed ducts 63 may be adjusted in a suitable manner. If the secondary transfer unit 26 and the fixed ducts 63 are disposed more closely together so that the cooling fans 61 are disposed close to the pressure roller 51, loss of delivered air is reduced to a minimum.

The image forming apparatus 1 includes a temperature sensing section 55 that senses the temperature of the surface of the pressure roller 51. The temperature sensing section 55 is composed of a contact thermistor or a non-contact thermistor. Results of sensing by the temperature sensing section 55 are transmitted to a CPU (not shown) in the image forming apparatus 1. The rotational speed of the cooling fans 61 are controlled based on those results. The control of the rotational speed of the cooling fans 61 enables the pressure roller 51 to be maintained at a suitable temperature, which in turn further alleviates uneven temperature.

The temperature sensing section 55 is disposed at a position that matches that of one of the cooling fans 61 when viewed perpendicular to axial direction A and that is distanced from the region cooled by the cooling fans 61. In other words, the temperature sensing section 55 is disposed upstream of one of the cooling openings 62*b* in terms of rotational direction R. This structure enables sensing of the temperature of the region cooled by the cooling fans 61 without receiving the air delivered by one of the cooling ducts 62. In the present embodiment, there is provided a single temperature sensing section 55 at a position associated with one of the cooling fans 61. The invention is by no means limited to this example. Alternatively, there may be provided two temperature sensing sections 55 for the two respective cooling fans 61.

The image forming apparatus 1 further includes a first thermistor 56 that senses the temperature of the surface of the pressure roller 51 at its middle part in terms of axial direction A and a second thermistor 57 that senses the temperature of the surface of the fixing belt 54. The second thermistor 57 is disposed to face the middle part of the heating roller 53 in terms of the axial direction. The first thermistor 56 and the second thermistor 57 are preferably composed of non-contact thermistors.

As mentioned earlier, the image forming apparatus 1 in accordance with an embodiment of the present invention includes: the printing paper transport path S in which printing paper is transported; the secondary transfer unit 26 and the fixing section 17 both disposed on the printing paper transport path S; the open/close cover 41 that, when opened, exposes the printing paper transport path S in the main body 110 of the image forming apparatus 1; the pressure roller 51, disposed in the fixing section 17, that presses the printing paper on a side thereof facing the open/close cover 41 against the printing paper transport path S; and the cooling fans 61 that cool down the pressure roller 51. The secondary transfer unit 26 and the cooling fans 61 are attached to the open/close cover 41 and disposed at such positions that the secondary transfer unit 26 and the cooling fans 61 move following overlapping paths when the open/close cover 41 is opened/closed.

This structure efficiently utilizes limited internal space to effectively cool down the pressure roller 51, thereby providing a size-reduction facilitating structure. The attaching of the cooling fans 61 to the open/close cover 41 prevents the structure from disrupting the travel of the secondary transfer unit 26 when the open/close cover 41 is opened/closed.

As mentioned earlier, the cooling of the end portions of the pressure roller 51 of which the temperature is difficult to lower alleviates uneven temperature of the pressure roller 51. More specifically, the pressure roller 51 cools down on its surface because it is in contact with printing paper while transporting it. The end portions of the pressure roller 51 contact printing paper only when the printing paper is of large sizes. Repeated fixing therefore leads to uneven temperature of the pressure roller 51. The alleviation of such uneven temperature eliminates improper fixing at the end portions of large-sized printing paper and wearing of the end portions of the overheated fixing section 17.

The concentrated cooling of the upstream of the nip area N by means of the cooling ducts 62 prevents improper fixing by the fixing section 17. More specifically, since the pressure roller 51 is rotating while transporting printing paper, the nip area N can be cooled down by cooling any part of the pressure roller 51. The cooled part, however, is heated by the heat transferred from the surroundings, which lessens the cooling effects before reaching the nip area N. It is therefore preferable to cool down those parts that are as close to the nip area N as possible. The provision of the cooling ducts 62 alleviates constraints on the positions of the cooling fans 61, enabling the cooling fans 61 to be disposed where there exists sufficient space.

Next will be described a variation example in which the position of the temperature sensing section 55 is changed.

Figure 4:
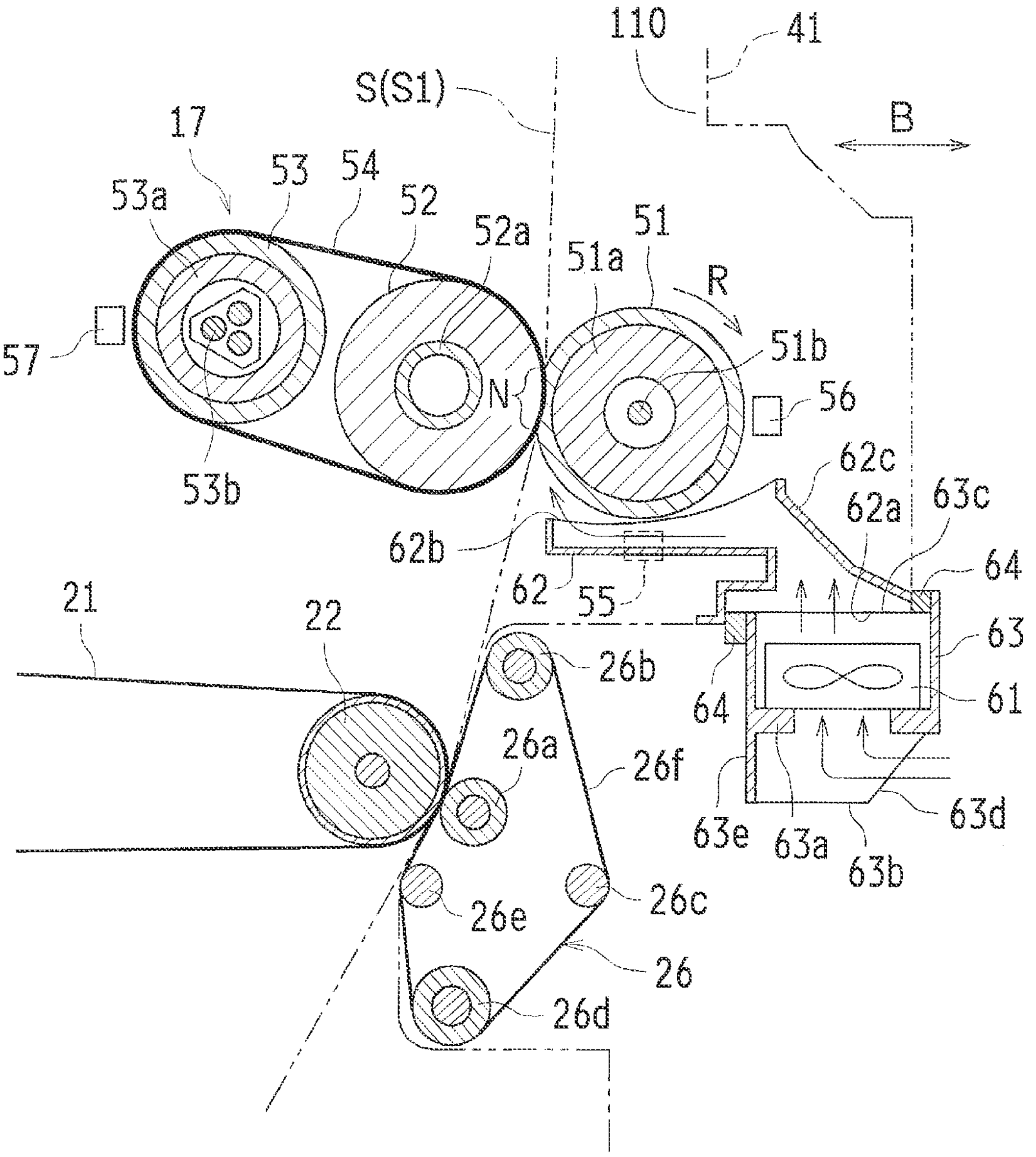
FIG. 4 is a scaled-up cross-sectional view of a variation example in which the position of a temperature sensing section in FIG. 2 is changed.
Figure 5:
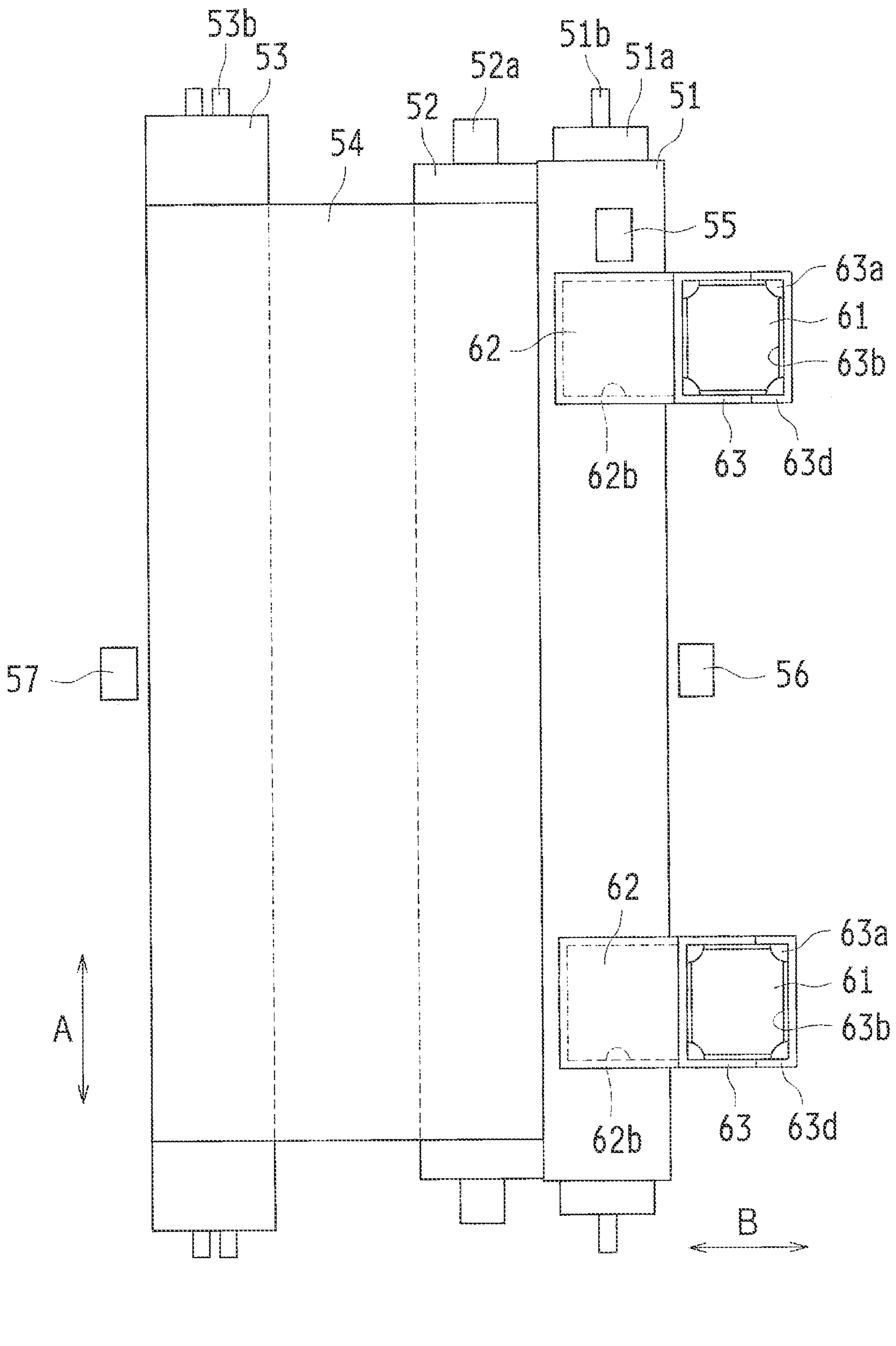
FIG. 5 is a plan view of the fixing section in FIG. 4 as it is viewed from the secondary transfer unit.

FIG. 4 is a scaled-up cross-sectional view of a variation example in which the position of the temperature sensing section 55 in FIG. 2 is changed. FIG. 5 is a plan view of the fixing section 17 in FIG. 4 as it is viewed from the secondary transfer unit 26.

The temperature sensing section 55 is disposed closer to one of the end portions of the pressure roller 51 in terms of axial direction A than the region cooled by one of the cooling fans 61 is to that end portion. In other words, the temperature sensing section 55 in the variation example is disposed closer to one of the end portions of the pressure roller 51 in terms of axial direction A than one of the cooling openings 62*b* of one of the cooling ducts 62 is to that end portion. This structure enables sensing of the temperature of a region not directly cooled by the cooling fans 61, thereby giving an approximate understanding of levels of temperature unevenness.

Results of sensing by the first thermistor 56 and the second thermistor 57 may be taken into consideration in controlling the rotational speed of the cooling fans 61. The uneven temperature of the fixing section 17 can be appreciated by sensing a temperature difference between the middle part of the pressure roller 51 and the end portions of the fixing belt 54 and the pressure roller 51.

Next will be described an operation that opens/closes the open/close cover 41.

Figure 6:
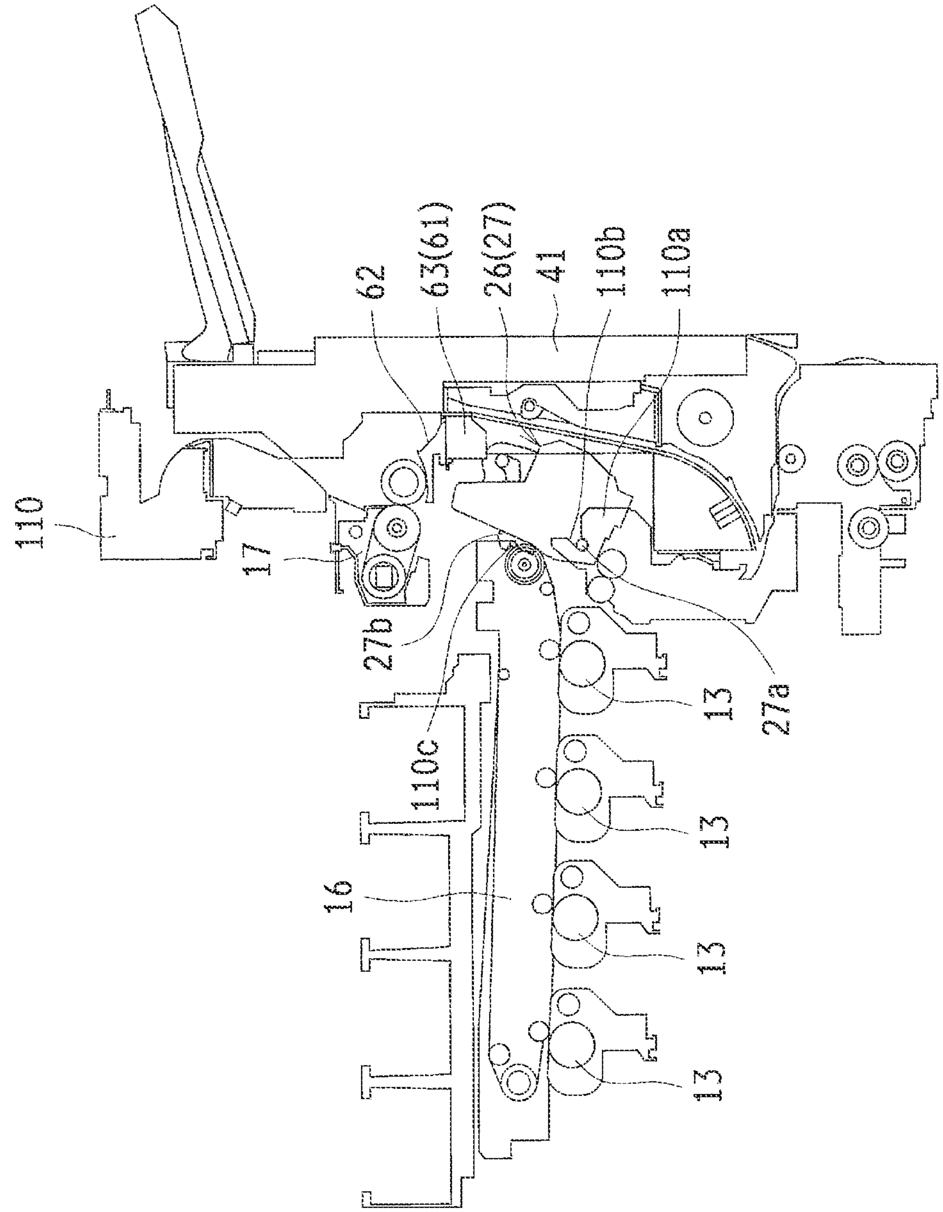
FIG. 6 is an illustration of a closed open/close cover for an image forming apparatus in accordance with an embodiment of the present invention.

FIG. 6 is an illustration of the closed open/close cover 41 for an image forming apparatus in accordance with an embodiment of the present invention. FIG. 7 is an illustration of the open/close cover shown in FIG. 6 when it is open.

The open/close cover 41 is a sliding cover that moves relative to the main body 110 along a straight line in the horizontal direction. In other words, direction B in which the open/close cover 41 is moved in opening/closing it in the structure shown in FIGS. 6 and 7 matches the horizontal direction. The open/close cover 41 may, if necessary, be provided, for example, with a handle for the user to hold in opening/closing the open/close cover 41.

The frame 27 of the secondary transfer unit 26 is provided with a latch rod 27*a* and a positioning section 27*b* on its side facing the main body 110. The main body 110 is provided with a latch section 110*a* with a latch groove 110*b* thereon that is open to the latch rod 27*a* and also with a positioning boss 110*c* disposed at a position that corresponds to the positioning section 27*b*. The positioning section 27*b* is provided with a positioning groove 27*c* that is open to the positioning boss 110*c*.

As illustrated in FIG. 6, when the open/close cover 41 is closed, the latch rod 27*a* is moved into, and latched by, the latch groove 110*b*, whereas the positioning boss 110*c* is moved into, and latched by, the positioning groove 27*c*. These motions place the secondary transfer unit 26 in the right position so that it is latched by the main body 110, and couple the cooling fans 61 (fixed ducts 63) to the cooling ducts 62.

Figure 7:
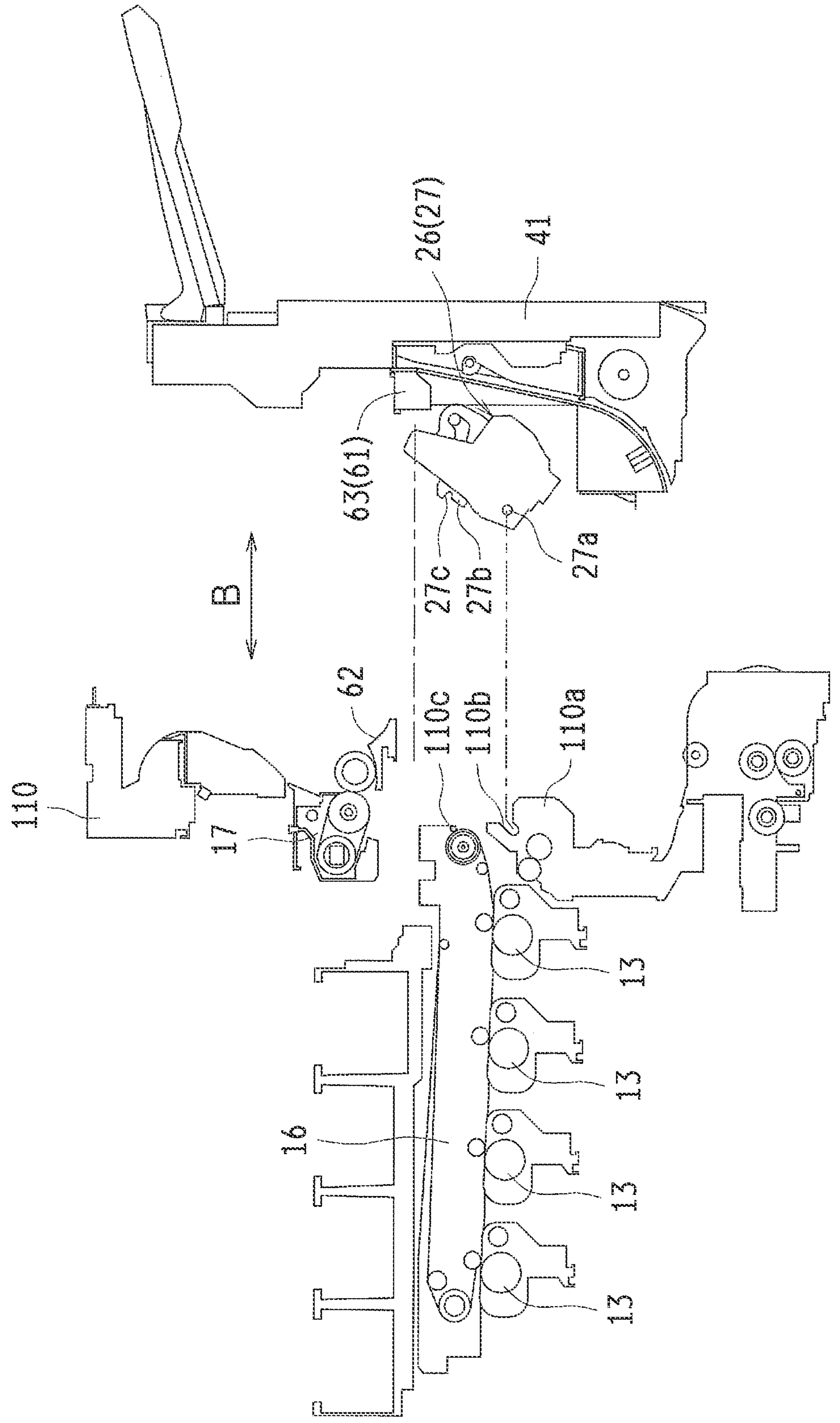
FIG. 7 is an illustration of the open/close cover shown in FIG. 6 when it is open.

As illustrated in FIG. 7, by opening the open/close cover 41, the latch rod 27*a* is released from the latch groove 110*b*, and the positioning boss 110*c* is released from the positioning groove 27*c*. The secondary transfer unit 26 and the cooling fans 61 (fixed ducts 63), together with the open/close cover 41, then separate from the main body 110, exposing the printing paper transport path S.

Next will be described a variation example of the open/close cover 41.

Figure 8:
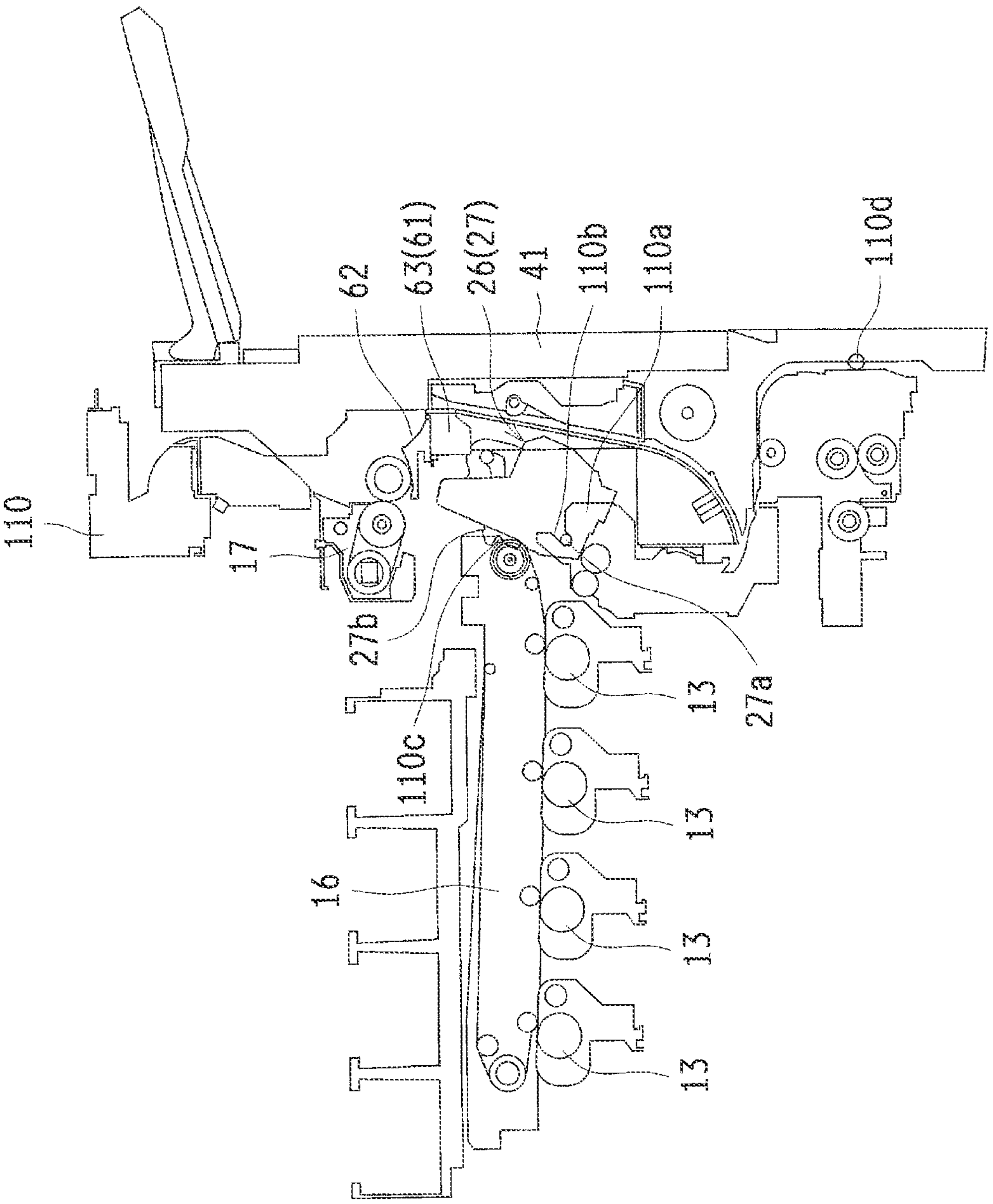
FIG. 8 is an illustration of a variation example of the open/close cover when it is closed.
Figure 9:
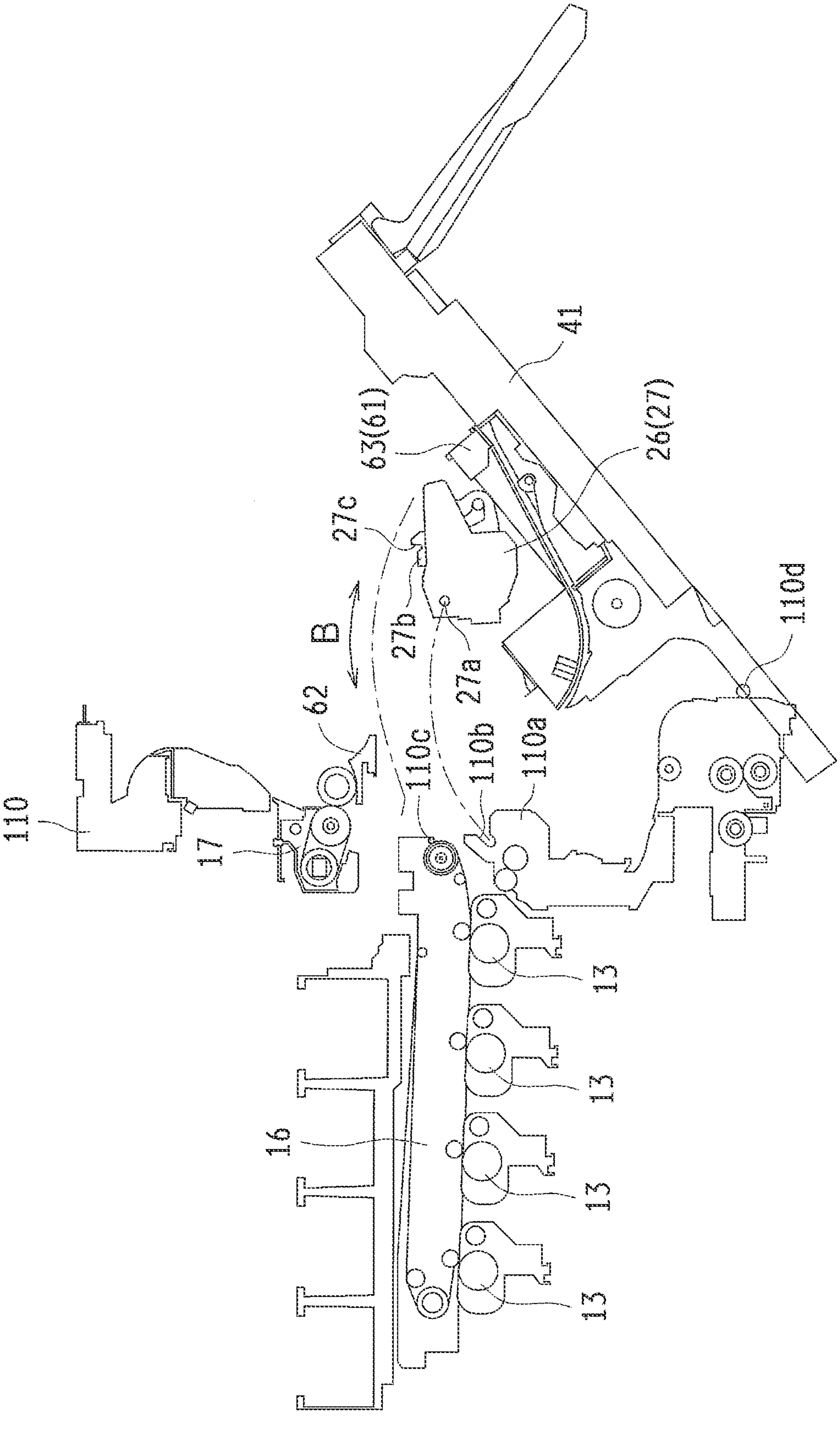
FIG. 9 is an illustration of the variation example of the open/close cover shown in FIG. 8 when it is open.

FIG. 8 is an illustration of a variation example of the open/close cover 41 when it is closed. FIG. 9 is an illustration of the variation example of the open/close cover shown in FIG. 8 when it is open.

The open/close cover 41 and the main body 110 in the variation example are coupled via a support rod 110*d* so that the open/close cover 41 can pivot around the support rod 110*d*. In other words, direction B in which the open/close cover 41 is moved in opening/closing it in the structure shown in FIGS. 8 and 9 matches the direction of rotation around the support rod 110*d*. The support rod 110*d* is disposed near an end portion of the main body 110 (near the bottom in FIGS. 8 and 9).

As illustrated in FIG. 9, as the open/close cover 41 is opened, the secondary transfer unit 26 and the cooling fans 61 (fixed ducts 63), together with the open/close cover 41, separate from the main body 110, exposing the printing paper transport path S.

The embodiments disclosed here are illustrative in all respects and never give any basis for restrictive interpretation. Therefore, the technical scope of the present invention should not be interpreted in the context of the embodiments, but should be delineated by the patent claims. The technical scope of the present invention further encompasses equivalents and modifications of the invention as they are defined in the patent claims.

The present application hereby claims priority on Japanese Patent Application, Tokugan, No. 2012-057110 filed Mar. 14, 2012 in Japan, the entire contents of which are hereby incorporated herein by reference.

INDUSTRIAL APPLICABILITY

The present invention is applicable generally to image forming apparatuses and in particular to usages where the pressure roller is effectively cooled down through efficient use of the apparatus's limited internal space.

REFERENCE SIGNS LIST

1 Image Forming Apparatus
17 Fixing Section
21 Intermediate Transfer Belt

22 Intermediate Transfer Belt Drive Roller
26 Secondary Transfer Unit
41 Open/close Cover
51 Pressure Roller
52 Fixing Roller
53 Heating Roller
54 Fixing Belt
55 Temperature Sensing Section
61 Cooling Fan
62 Cooling Duct
62*a* Coupling Opening
62*b* Cooling Opening
62*c* Air Guiding Face
63 Fixed Duct
63*a* Projection
63*b* Air Inlet Opening
63*c* Air Outlet Opening
63*d* Notch
63*e* Blocking Wall
64 Moltopren®
A Axial Direction
B Open/close Direction
R Rotational Direction

The invention claimed is:

1. An image forming apparatus, comprising:

a printing paper transport path in which printing paper is transported;

a fixing section disposed on the printing paper transport path;

an open/close cover that, when opened, exposes the printing paper transport path in a main body of the apparatus;

a fan that flows air to a rotation member disposed in the fixing section, a first duct, attached to the main body, that guides the air owing to the fan; and a second duct attached to the open/close cover, wherein the air owing to the fan flows through the first duct and the second duct when the open/close cover is closed.

2. The image forming apparatus as set forth in claim 1, wherein the second duct comprises a buffer member to alleviate an impact between the main body and the open/close cover when the open/close cover is closed.

3. The image forming apparatus as set forth in claim 1, wherein the first duct guides air from the fan to the rotation member and delivers air toward a surface of the rotation member near a nip section where the rotation member presses the printing paper.

4. The image forming apparatus as set forth in claim 1, further comprising an air guiding face that guides air from the fan toward the rotation member.

5. The image forming apparatus as set forth in claim 4, wherein the air guiding faces tilt in a direction from the fan toward the rotation member.

6. The image forming apparatus as set forth in claim 1, wherein the fan is disposed at positions facing the rotation member at end portions of the rotation member in terms of an axial direction thereof.

7. The image forming apparatus as set forth in claim 1, wherein the printing paper transport path is a vertical transport path in which printing paper is transported vertically upward, and the fan is disposed below the rotation member.

8. An image forming apparatus, comprising:

a printing paper transport path in which printing paper is transported;

a fixing section disposed on the printing paper transport path;

an open/close cover that, when opened, exposes the printing paper transport path in a main body of the apparatus;

a fan that flows air to a rotation member disposed in the fixing section, a first duct, attached to the main body, that comprises a first opening to oppose the fan; and a second duct attached to the open/close cover, wherein the second duct comprises a second opening that opposes the first opening when the open/close cover is closed.

9. The image forming apparatus as set forth in claim 8, wherein the second duct comprises a buffer member to alleviate an impact between the main body and the open/close cover when the open/close cover is closed.

10. The image forming apparatus as set forth in claim 8, wherein the first duct guides air from the fan to the rotation member and delivers air toward a surface of the rotation member near a nip section where the rotation member presses the printing paper.

11. The image forming apparatus as set forth in claim 8, further comprising an air guiding face that guides air from the fan toward the rotation member.

12. The image forming apparatus as set forth in claim 11, wherein the air guiding faces tilt in a direction from the fan toward the rotation member.

13. The image forming apparatus as set forth in claim 8, wherein the fan is disposed at positions facing the rotation member at end portions of the rotation member in terms of an axial direction thereof.

14. The image forming apparatus as set forth in claim 8, wherein the printing paper transport path is a vertical transport path in which printing paper is transported vertically upward, and the fan is disposed below the rotation member.

* * * * *